United States Patent
Ishii (10) Patent No.: US 7,481,904 B2
(45) Date of Patent: Jan. 27, 2009

(54) PLASMA DEVICE

(75) Inventor: Nobuo Ishii, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 417 days.

(21) Appl. No.: 10/508,055

(22) PCT Filed: Mar. 18, 2002

(86) PCT No.: PCT/JP02/02567

§ 371 (c)(1),
(2), (4) Date: Sep. 17, 2004

(87) PCT Pub. No.: WO03/079740

PCT Pub. Date: Sep. 25, 2003

(65) Prior Publication Data

US 2005/0103443 A1    May 19, 2005

(51) Int. Cl.
*C23F 1/00*     (2006.01)
*H01L 21/306*   (2006.01)
*C23C 16/00*    (2006.01)

(52) U.S. Cl. ............................ 156/345.48; 118/723 I (58) Field of Classification Search ............ 156/345.48, 156/345.49; 118/722, 723 R, 723 AN, 723 I, 118/723 IR
See application file for complete search history.

(56) References Cited

U.S. PATENT DOCUMENTS 4,990,229 A *  2/1991  Campbell et al. ...... 204/298.06
5,571,366 A    11/1996  Ishii et al.
5,919,382 A     7/1999  Qian et al.
6,447,635 B1 *  9/2002  Ra ..................... 156/345.48
6,719,876 B1 *  4/2004  Ueda et al. ............ 156/345.48

FOREIGN PATENT DOCUMENTS

| EP | 1130948 A   | 9/2001  |
| JP | 59-154803 A | 9/1984  |
| JP | 3-68773 A   | 3/1991  |
| JP | 8-195296 A  | 7/1996  |
| JP | 9-293-600 A | 11/1997 |

(Continued)

OTHER PUBLICATIONS

English Machine Translation of JP 09-293600A to Nakagawa et al. Obtained from http://www19.ipdl.inpit.go.jp/PA1/cgi-bin/PA1DETAIL on Sep. 27, 2007.*

(Continued)

*Primary Examiner*—Parviz Hassanzadeh
*Assistant Examiner*—Maureen G Arancibia
(74) *Attorney, Agent, or Firm*—Crowell & Moring LLP (57) ABSTRACT

An etching apparatus has an antenna connected to a radio frequency power supply through a matching box. At the center region of a dielectric plate, a columnar conductor and a cylindrical conduct ring are arranged. Between the columnar conductor and the conductor ring, four conducting wires, each of which forms a substantially circular loop outside the conductor ring, are connected in parallel with the radio frequency power supply. A loop formed by each of the conducting wires is arranged at an equal spacing with each other to be rotationally-symmetric around the axis orthogonal to a mounting table, with the columnar conductor as the center. The loops are arranged on the same plane such that a surface where each loop is placed faces the mounting table.

7 Claims, 8 Drawing Sheets

FOREIGN PATENT DOCUMENTS

| | | |
|---|---|---|
| JP | 2000-310697 A | 11/2000 |
| JP | 2002-100610 A | 4/2002 |
| JP | 2002-100615 A | 4/2002 |
| WO | WO0119144 A1 * | 3/2001 |

OTHER PUBLICATIONS

English Machine Translation of JP 2003-310697A to Yaginuma et al. Obtained from http://www.ipdl.inpit.go.jp/homepg_e.ipdl on Mar. 7, 2008.*

* cited by examiner

ELECTRIC FIELD INTENSITY

PLASMA DEVICE

TECHNICAL FIELD

The present invention relates to a plasma apparatus generating plasma by a radio-frequency wave to perform a prescribed processing.

BACKGROUND ART

A plasma apparatus is widely used in manufacturing a semiconductor device, a flat panel display and the like to perform a processing such as oxide film formation, crystal growth of a semiconductor layer, etching and ashing.

Among such plasma apparatuses, there is a radio frequency plasma apparatus which introduces a radio-frequency wave into a processing chamber from an antenna and generates high density plasma. The radio frequency plasma apparatus is characterized in that it can generate plasma stably even when the pressure of plasma gas is relatively low, and thus, can be applied widely.

Figure 8:
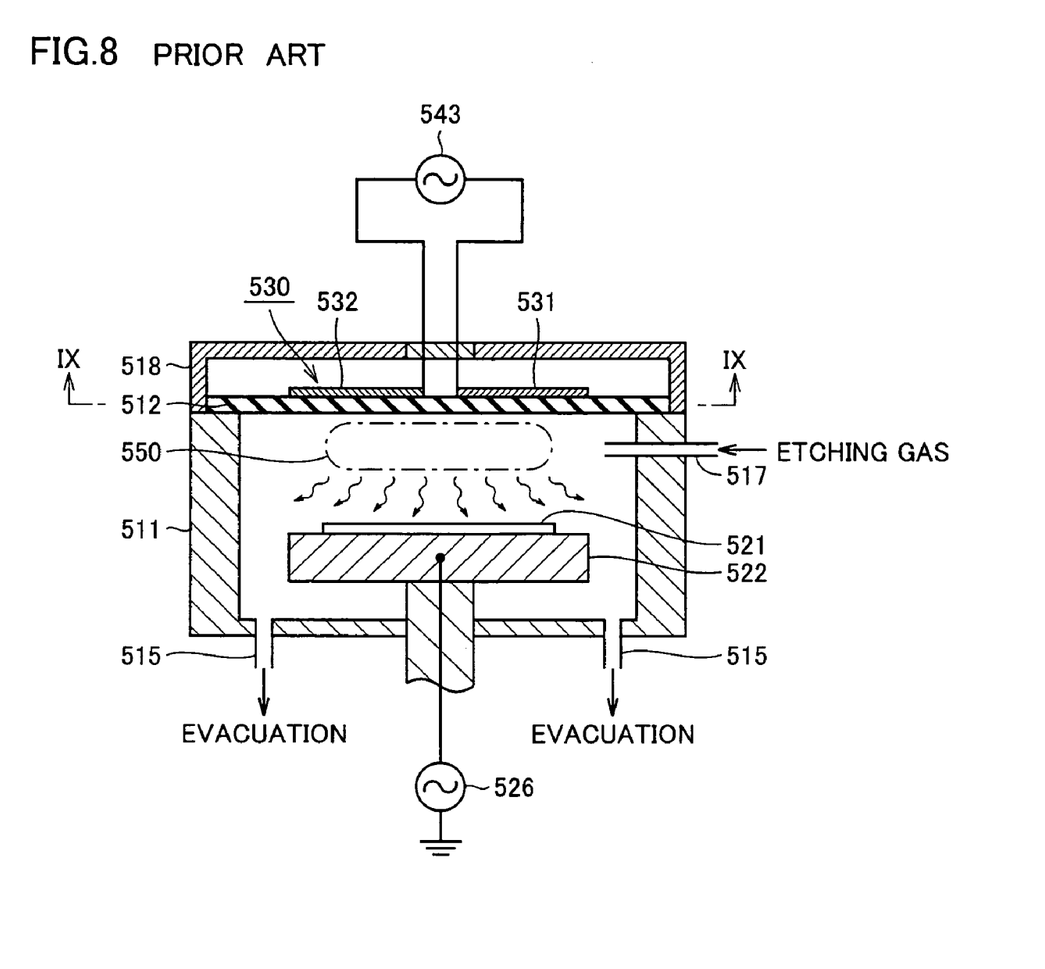
FIG. 8 is a cross sectional view showing a configuration of an etching apparatus using a conventional radio frequency plasma apparatus.

FIG. 8 is a cross sectional view showing a configuration of an etching apparatus which uses a conventional radio frequency plasma apparatus. In the etching apparatus, a cylindrical processing chamber 511 opened at an upper portion and a dielectric plate 512 covering the upper opening of processing chamber 511 form a hermetic chamber.

At a bottom of processing chamber 511, an exhaust port 515 is provided for vacuum evacuation. At a sidewall of processing chamber 511, an etching gas supply nozzle 517 is provided. Processing chamber 511 accommodates a mounting table 522 for placing thereon a substrate 521 to be etched. Mounting table 522 is connected to a radio frequency power supply 526 for bias voltage.

Above dielectric plate 512, a dipole antenna 530 is arranged to supply a radio-frequency wave into processing chamber 511 through dielectric plate 512. Peripheries of dielectric plate 512 and antenna 530 are covered with a shield member 518. Dipole antenna 530 is connected to a radio frequency power supply 543 for power supply.

Figure 9A:
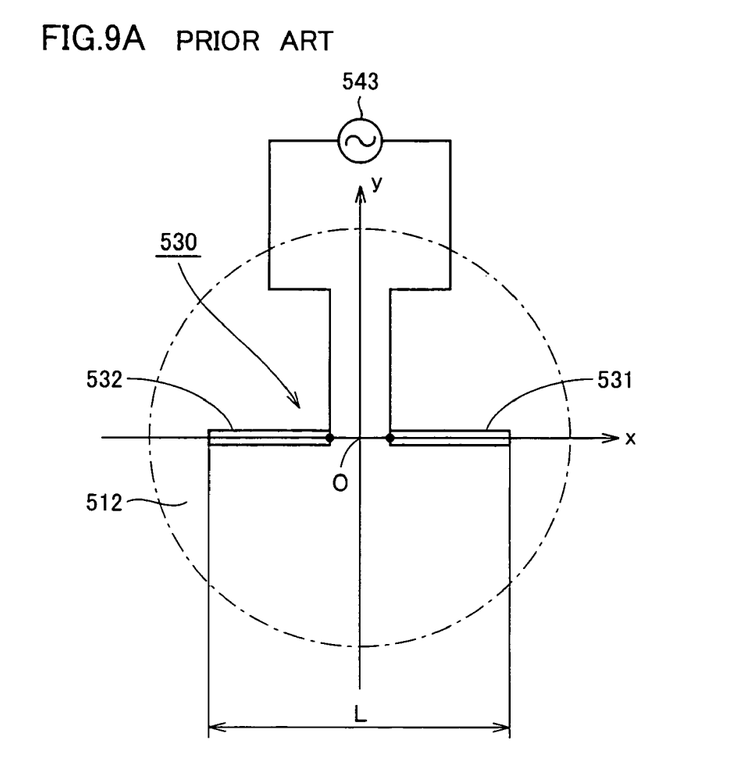
FIG. 9A shows a configuration of a dipole antenna shown in FIG. 8.
Figure 9B:
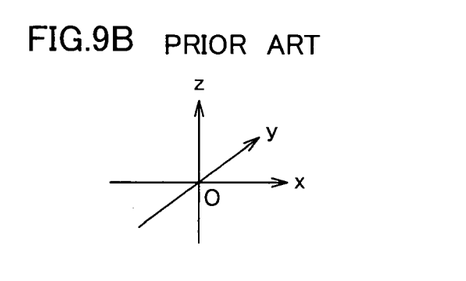
FIG. 9B shows a coordinate system of the dipole antenna shown in FIG. 9A.

FIG. 9A, showing a configuration of dipole antenna 530 shown in FIG. 8, is a plan view of dipole antenna 530 taken from a line IX-IX in FIG. 8. FIG. 9B shows a coordinate system thereof.

Dipole antenna 530 has two conductor rods 531 and 532 arranged linearly in parallel with the main surface of dielectric plate 512. When the wavelength of the electromagnetic field above dipole antenna 530 is $\lambda g$, the length of each of conductor rods 531 and 532 is about $\lambda g/4$, and the entire length L of antenna 530 is about $\lambda g/2$. Radio frequency power supply 543 for power supply is connected to opposite end portions of conductor rods 531 and 532, which are spaced apart.

For convenience of description, a rectangular coordinate system is established as follows: the center axis of conductor rods 531 and 532 is defined as the x-axis, and the center between opposite end portions of conductor rods 531 and 532 is defined as the origin o. An axis orthogonal to the x-axis and parallel with the main surface of dielectric plate 512 is defined as the y-axis. An axis orthogonal to the main surface of dielectric plate 512 is defined as the z-axis.

An operation of the etching apparatus shown in FIG. 8 will now be described. Processing chamber 511 is evacuated to a prescribed degree of vacuum, with substrate 521 placed on the top surface of mounting table 522. An etching gas is then supplied through nozzle 517 with its flow rate being controlled. In this state, when power is fed from radio frequency power supply 545 to dipole antenna 530, resonance occurs because the entire length L of antenna 530 is about $\lambda g/2$. Consequently, large current flows through antenna 530, from which a radio-frequency wave is emitted. The radio-frequency wave passes through dielectric plate 512 to be introduced into the processing chamber.

The electric field of the radio-frequency wave introduced into processing chamber 511 causes ionization of the gas in processing chamber 511 to generate plasma at the space 550 upper of substrate 521 that is the object of processing. The plasma diffuses in processing chamber 511 and has its energy and anisotropy controlled by a bias voltage (several hundred kHz-several MHz) applied to mounting table 522 for use in the etching process.

Figure 10A:
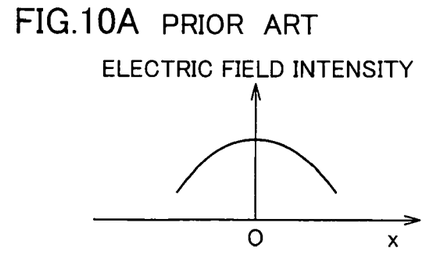
FIG. 10A is a first schematic view showing a radiation characteristic of the dipole antenna shown in FIG. 9A.
Figure 10B:
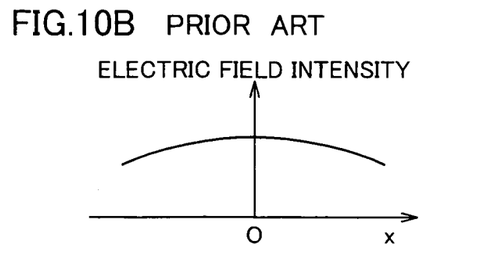
FIG. 10B is a second schematic view showing a radiation characteristic of the dipole antenna shown in FIG. 9A.

FIG. 10A and FIG. 10B are schematic views showing the radiation characteristic of dipole antenna 530 shown in FIG. 9A. FIG. 10A and FIG. 10B show electric field intensity distribution in the xz-plane and in the yz-plane, respectively.

Intensity of the electric field formed by dipole antenna 530 is at maximum at origin o, i.e., the center of dipole antenna 530, and is gradually lowered in proportion with a distance from origin o in the direction of the x-axis or the y-axis. It is noted that since the radio-frequency wave output from dipole antenna 530 is a linearly polarized wave parallel with the x-axis, the electric field intensity distribution in the yz-plane exhibits a gentle gradient whereas that in the xz-plane exhibits a steep gradient.

When an electric field with the intensity distribution as shown in FIG. 10A and FIG. 10B is used to generate plasma, plasma density is lowered at the outer periphery (the peripheral edge at a plane parallel with the xy-plane) of upper space 550 of substrate 521.

Furthermore, plasma generated in space 550 diffuses toward mounting table 522. Plasma traveling from the outer periphery of space 550 to the sidewall of processing chamber 511 dissipates. Thus, even though the plasma density in upper space 550 is kept uniform, the plasma arriving in the neighborhood of the periphery of the top surface of substrate 521 is smaller than that arriving around the center of substrate 521. Consequently, the plasma density in the neighborhood of the periphery of the top surface of substrate 521 is lower than that around the center thereof.

With these two synergistic effects, when dipole antenna 530 is used to generate plasma, the plasma processing rate is disadvantageously lowered in the vicinity of the periphery of substrate 521 where plasma density is low.

DISCLOSURE OF THE INVENTION

The present invention is provided to solve such a problem. An object thereof is to provide a plasma apparatus in which plasma distribution is improved in the vicinity of a periphery of the top surface of an element to be processed such as a substrate, and to attain uniformity of the plasma processing rate.

A plasma apparatus in accordance with the present invention includes a processing chamber, an antenna, and a radio frequency power supply. The processing chamber carries an element to be processed to perform a prescribed process thereon. The antenna has a plurality of loops, each formed by a conducting wire, to supply a radio-frequency wave into the processing chamber. The radio frequency power supply supplies power to the antenna. Each of the plurality of loops, having substantially the same perimetric length, is connected in parallel with the radio frequency power supply and is arranged on a plane facing the element to be processed carried in the processing chamber.

According to the configuration, since the antenna is configured to have a plurality of loops, a strong electric field is established at a region facing the periphery of the top surface of the element to be processed, and high density plasma can be generated in this region. Therefore, even though the plasma traveling toward the inner wall of the processing chamber dissipates, plasma distribution can be improved in the vicinity of the periphery of the top surface of the element to be processed, and uniformity of the plasma processing rate can be improved.

Preferably, the antenna further includes: a first conductor member arranged at a position facing a center region of the element to be processed carried in the processing chamber and connected to one end of the radio frequency power supply; and a second conductor member arranged around the first conductor member and connected to the other end of the radio frequency power supply. Preferably, each of the plurality of loops has one end of the conducting wire connected to the first conductor member, and the other end of the conducting wire connected to the second conductor member. Preferably, each of the plurality of loops is located outside the second conductor member.

Alternatively, the antenna further includes: a first conductor member arranged at a position facing the center region of the element to be processed carried in the processing chamber and connected to the radio frequency power supply; and a second conductor member arranged around the first conductor member and connected to ground. Preferably, each of the plurality of loops has one end of the conducting wire connected to the first conductor member, and the other end of the conducting wire connected to the second conductor member. Preferably, each of the plurality of loops is located outside the second conductor member.

Preferably, each of the plurality of loops has a part of the conducting wire arranged to face a periphery of the element to be processed carried in the processing chamber.

Preferably, each of the plurality of loops is arranged at an equal spacing with each other to be rotationally-symmetric around the axis orthogonal to the element to be processed carried in the processing chamber.

By the radio frequency current in phase at the outer periphery of each loop remote from the first conductor member and the second conductor member in the above-described configuration, an effect can be obtained similar to that of a configuration in which loop-shaped current is generated at the region along the outer peripheries of respective loops. Since the loop-shaped current has a larger diameter than that of the loop formed by each of the conducting wires, an antenna having a loop of virtually larger diameter can be formed by the loop-shaped current. Since the second conductor member is prepared separately from the sidewall of the processing chamber, an inductive electric field caused by the current flowing through the antenna will not be directed to the sidewall of the processing chamber. Accordingly, the charged particles constituting the plasma will not sputter against the sidewall of the processing chamber, and thus can prevent dust generation during the process.

Alternatively, the antenna includes an even number of loops as a plurality of loops. Preferably, each of the even number of loops is arranged to be located on a plane where each of the plurality of loops is arranged and to be symmetric with each other relative to a straight line running through the center of the first conductor member. Preferably, each of the loops located on one side of the line running through the center of the first conductor member among the even number of loops, is arranged at an equal spacing with each other to be rotationally-symmetric around the axis orthogonal to the element to be processed carried in the processing chamber.

By the radio frequency current at the outer periphery of each of the loops in the above-described configuration, two dipole currents are generated. Furthermore, radio frequency current occurs in the vicinity of a base of each of the loops, i.e., in the vicinity of a junction where each of the conducting wires is connected to the first and second conductor members, and thus causes one dipole current. Accordingly, a multiple dipole antenna can be formed virtually.

Preferably, the perimetric length of each of the plurality of loops is substantially a natural number multiple of the wavelength of radio frequency current flowing through the conducting wires forming the loops.

According to the configuration, resonance occurs and large radio frequency current flows. As a result, high output can be obtained.

The perimetric length of each of the plurality of loops may be shorter than the wavelength of radio frequency current flowing through the conducting wires forming the loops.

BEST MODES FOR CARRYING OUT THE INVENTION

Embodiments in which a plasma apparatus in accordance with the present invention is applied to an etching apparatus will be described.

First Embodiment

Figure 1:
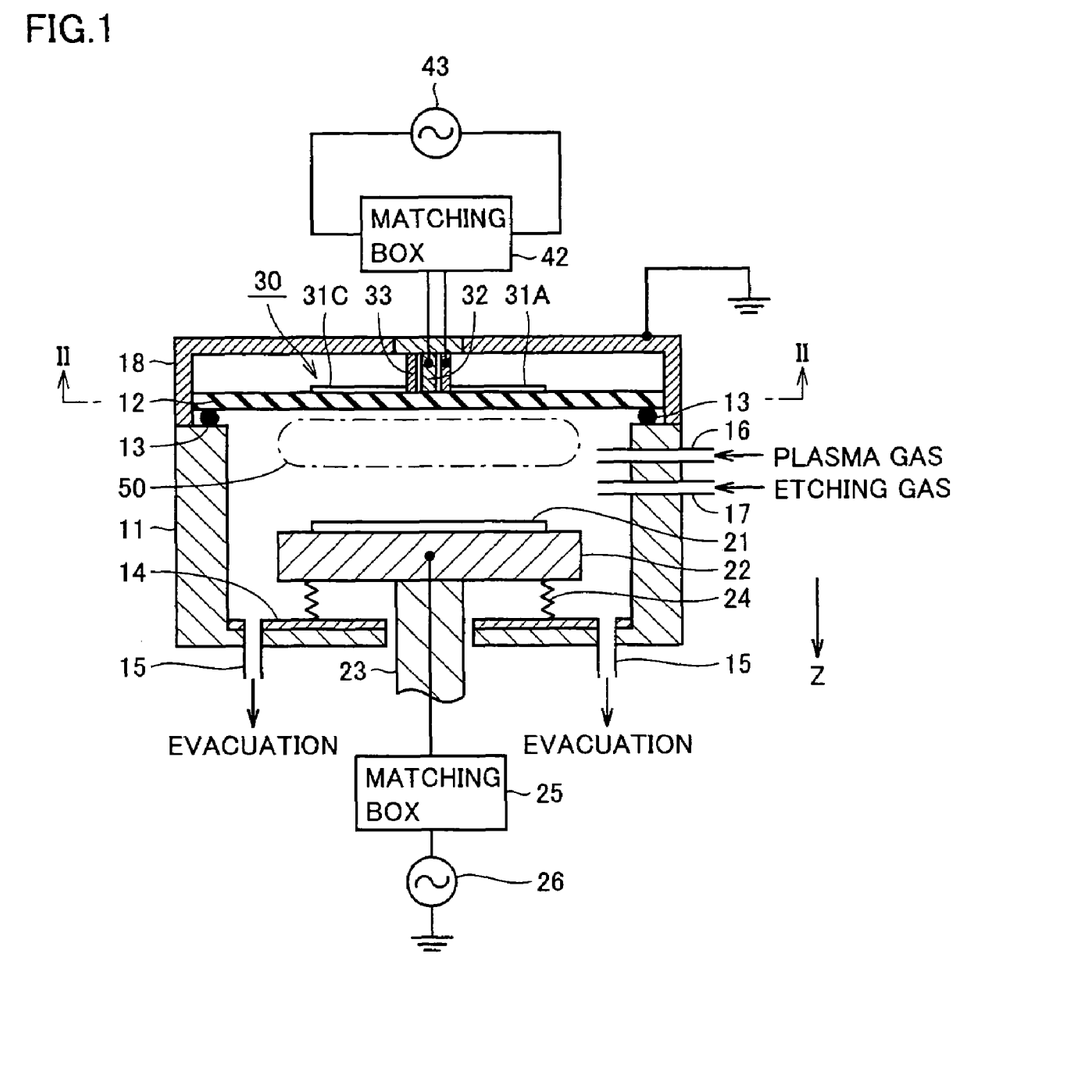
FIG. 1 is a cross sectional view showing a configuration of an etching apparatus in accordance with a first embodiment of the present invention.

As shown in FIG. 1, an etching apparatus in accordance with a first embodiment of the present invention has a cylindrical processing chamber 11 opened at an upper portion. Processing chamber 11 is formed of a conductor member such as of aluminum.

At the upper opening of processing chamber 11, a dielectric plate 12 formed of quartz glass, ceramic (such as $Al_2O_3$, AlN) or the like having a thickness of about 20-30 mm is arranged. At the junction between processing chamber 11 and dielectric plate 12, a sealing member 13 such as an O-ring is interposed to assure hermeticity inside processing chamber 11.

At a bottom of processing chamber 11, an insulating plate 14 made of ceramic or the like is provided. An exhaust port 15 penetrating insulating plate 14 and the bottom of processing chamber 11 is provided. By means of a vacuum pump (not shown) communicated with exhaust port 15, processing chamber 11 can be evacuated to a desired degree of vacuum.

At upper and lower portions of a sidewall of processing chamber 11, a plasma gas supply nozzle 16 for introducing a plasma gas such as Ar into processing chamber 11, and a processing gas supply nozzle 17 for introducing an etching gas into processing chamber 11 are respectively provided. Each of nozzles 16 and 17 is formed by a quartz pipe, for example.

Processing chamber 11 accommodates mounting table 22 on which a substrate to be etched (an element to be processed) 21 is placed at the top surface. Mounting table 22 is supported by an elevation shaft 23 going, with a clearance, through the bottom of processing chamber 11 in a movable manner in upward and downward directions. Furthermore, mounting table 22 is connected through a matching box 25 to radio frequency power supply 26 for bias voltage having a frequency in the range of several hundred kHz to ten and several MHz. In order to ensure hermeticity of processing chamber 11, a bellows 24 is provided between mounting table 22 and insulating plate 14 so as to surround elevation shaft 23.

Above dielectric plate 12, an antenna 30 is arranged for supplying a radio-frequency wave into processing chamber 11 through dielectric plate 12. Antenna 30 is separated from processing chamber 11 by dielectric plate 12, and thus is protected from the plasma generated in processing chamber 11.

Furthermore, peripheries of dielectric plate 12 and antenna 30 are covered with a cylindrical shield member 18 opened at the bottom. Shield member 18 is formed of a metal such as aluminum and is connected to ground. Since a radio-frequency wave emitted from antenna 30 is blocked by shield member 18, the radio-frequency wave will not leak outside the etching apparatus.

Antenna 30 is connected to a radio frequency power supply 43 for power supply through a matching box 42. Radio frequency power supply 43 outputs high frequencies ranging from 100 MHz to 8 GHz. By providing matching box 42 for impedance matching, usage efficiency of power can be improved.

Figure 2A:
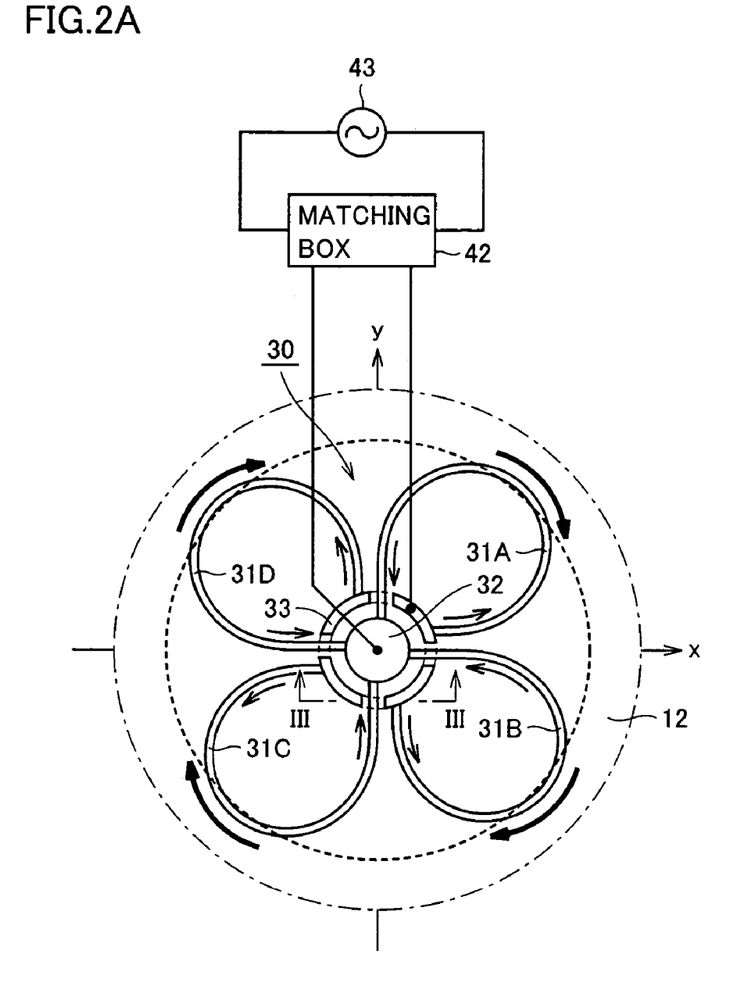
FIG. 2A shows a configuration of an antenna shown in FIG. 1 in the first embodiment of the present invention.
Figure 2B:
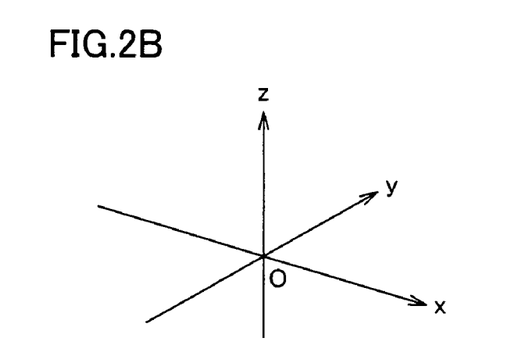
FIG. 2B shows a coordinate system of an antenna shown in FIG. 2A in the first embodiment of the present invention.

A configuration of antenna 30 shown in FIG. 1 will now be described. At the center region of dielectric plate 12 located above the center region of mounting table 22, a columnar conductor (a first conductor member) 32 is arranged as shown in FIG. 2A and FIG. 2B. Around columnar conductor 32, a cylindrical conductor ring (a second conductor member) 33 is arranged. Columnar conductor 32 is connected to one end of radio frequency power supply 43 through matching box 42. Conductor ring 33 is also connected to the other end of radio frequency power supply 43 through matching box 42.

Between columnar conductor 32 and conductor ring 33, four conducting wires 31A, 31B, 31C and 31D, each of which forms a substantially circular loop outside conductor ring 33, are connected in parallel with radio frequency power supply 43.

Each of conducting wires 31A-31D is spaced 90° apart from each other around columnar conductor 32. More specifically, the loop of each of conducting wires 31A-31D is arranged at an equal spacing with each other to be rotationally-symmetric around the axis orthogonal to mounting table 22, with columnar conductor 32 as the center.

The loops (conducting wires 31A-31D) are arranged on a same plane such that the plane where each of the loops is positioned faces mounting table 22. More specifically, conducting wires 31A-31D are arranged on the same plane which faces the element to be processed 21 placed on mounting table 22.

In this stage, the outer periphery (the portion most remote from columnar conductor 32) of each of the loops (conducting wires 31A-31D) is arranged to be located approximately right above the periphery of substrate 21 placed on mounting table 22.

Figure 3:
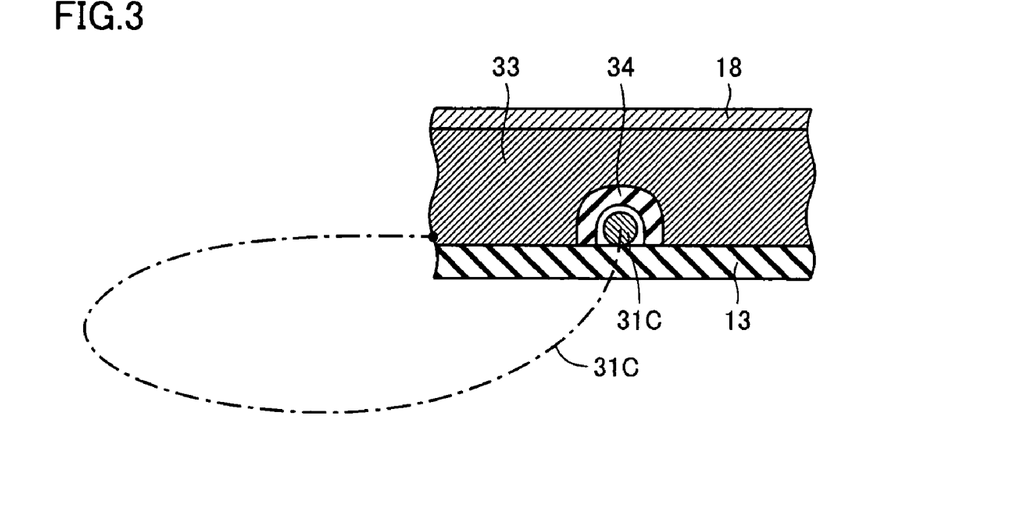
FIG. 3 is a cross sectional view taken along a line III-III shown in FIG. 2A in the first embodiment of the present invention.

For describing a configuration of the region where each of conducting wires 31A-31D crosses conductor ring 33, conducting wire 31C will be taken as an example. As shown in FIG. 3, conductor ring 33 is provided with a through hole, through which conducting wire 31C extends from the inside to the outside of conductor ring 33. In order to avoid contact between conducting wire 31C and conductor ring 33 in the through hole, an insulating member 34 is attached to the inner wall of the through hole. The same applies for other conducting wires 31A, 31B and 31D. Conductor ring 33 may or may not be directly connected electrically with shield member 18.

Conducting wires 31A-31D, columnar conductor 32 and conductor ring 33 described above are formed of copper, aluminum or the like. Each of conducting wires 31A-31D is made of the same material, has the same impedance, and forms a loop of the same shape and same perimetric length. In this configuration, the perimetric length of each of the loops (conducting wires 31A-31D) substantially corresponds to a wavelength λg of radio frequency current flowing through each of conducting wires 31A-31D.

An operation of antenna 30 will now be described. As shown in FIG. 2A, four conducting wires 31A-31D are connected to a lower end of a sidewall of columnar conductor 32 which is located at an electrically equal distance from radio frequency power supply 43. Since each of conducting wires 31A-31D has the same impedance, each of conducting wires 31A-31D is provided with current of same phase and same amplitude. Since the loop formed by each of conducting wires 31A-31D has the perimetric length of λg, the radio frequency current supplied to each of conducting wires 31A-31D resonates, resulting in a standing wave.

In this stage, in the vicinity of the base of each of the loops (conducting wires 31A-31D), i.e., in the vicinity of the junction where each of conducting wires 31A-31D is connected to columnar conductor 32 and conductor ring 33, the radio frequency current of adjacent conducting wires (see the arrow in thin solid line shown in FIG. 2A) flows in an opposite direction. Accordingly, the effect of the radio frequency current flowing through adjacent conducting wires cancels each other.

On the other hand, a standing wave in phase occurs in each of conducting wires 31A-31D. Accordingly, at the outer periphery of each of the loops (conducting wires 31A-31D), large radio frequency current in phase flows (see the arrow in bold solid line shown in FIG. 2A).

The radio frequency current in phase provides an effect similar to that of a configuration where loop-shaped current (see the bold dotted line shown in FIG. 2A) flows in the region along the outer periphery of each of the loops (conducting wires 31A-31D). Since the diameter of the loop-shaped current is larger than that of the loop formed by each of conducting wires 31A-31D, an antenna of a virtually larger loop can be formed by the loop-shaped current.

Since the inductance becomes lower as the diameter of the loop is smaller, antenna 30 is functionally equivalent to an antenna of a larger loop though its inductance is relatively small. Accordingly, if radio frequency power supply 43 of the same output is used for power supply, larger current flow and higher gain can be obtained by this configuration. In addition, since antenna 30 employs resonance for larger current flow, higher output can be achieved.

Figure 4A:
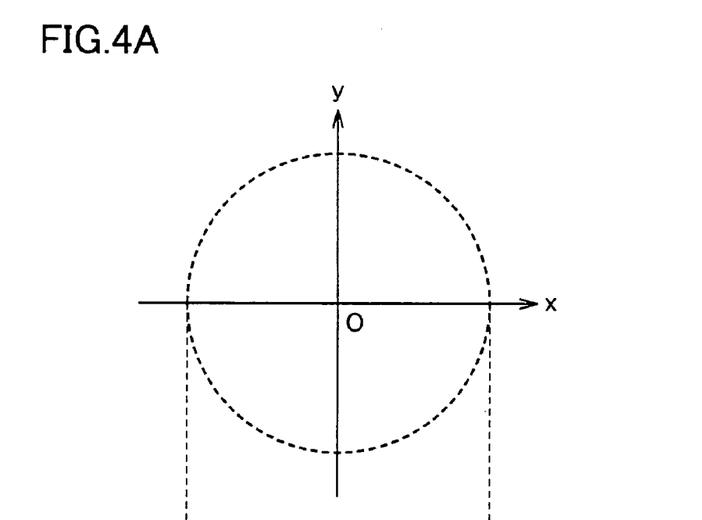
FIG. 4A is a first schematic view showing a radiation characteristic of an antenna shown in FIG. 1 in the first embodiment of the present invention.

A radiation characteristic of antenna 30 shown in FIG. 1 will now be described. As discussed above, antenna 30 is functionally equivalent to a single larger loop antenna of a large diameter, and as shown in FIG. 4A, the loop-shaped current shown in the bold dotted line forms an electric field.

Figure 4B:
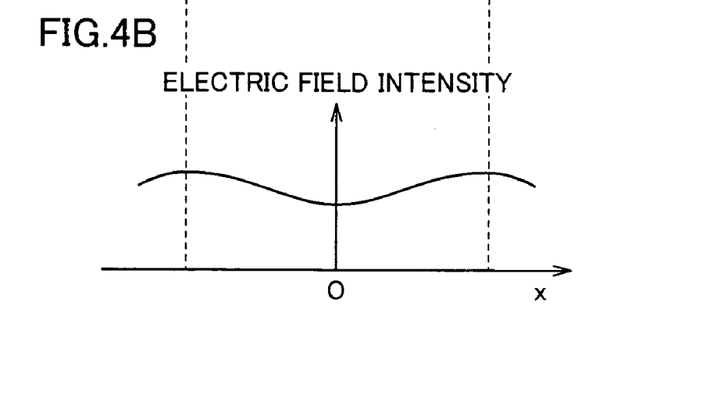
FIG. 4B is a second schematic view showing a radiation characteristic of the antenna shown in FIG. 1 in the first embodiment of the present invention.

Accordingly, the electric field intensity in the xz-plane is distributed as shown in FIG. 4B. More specifically, a strong electric field is established in the vicinity of the loop-shaped current, i.e., in the vicinity of the region along the outer periphery of a loop formed by each of conducting wires 31A-31D. The electric field intensity in the yz-plane is also distributed as shown in FIG. 4B, and a strong electric field is also formed in the vicinity of the loop-shaped current.

An operation of the etching apparatus shown in FIG. 1 will now be described. Processing chamber 11 is evacuated, for example, to a degree of vacuum of about 0.01 to 10 Pa, with substrate 21 placed at the top surface of mounting table 22. While maintaining the degree of vacuum, Ar is supplied as a plasma gas through plasma gas supply nozzle 16 and an etching gas such as $CF_4$ is supplied through processing gas supply nozzle 17, with the flow rate thereof being controlled.

With the plasma gas and the etching gas supplied to processing chamber 11, radio frequency power supply 43 supplies power to antenna 30, from which a radio-frequency wave is emitted. The radio-frequency wave passes through dielectric plate 12 and is introduced into processing chamber 11 to form an electric field in processing chamber 11.

The electric field intensity thereof is distributed as shown in FIG. 4B. More specifically, a stronger electric field is formed in the vicinity of the loop-shaped current shown in the bold dotted line in FIG. 2A, i.e., in the vicinity of a region along the outer periphery of a loop formed by each of conducting wires 31A-31D than in other regions.

As described above, since the outer periphery of each of the loops (conducting wires 31A-31D) is located approximately right above the peripheral edge of substrate 21, i.e., the object of processing, a relatively strong electric field is established approximately right above the periphery of substrate 21.

The electric field with such intensity distribution ionizes Ar in processing chamber 11 to generate plasma in upper space 50 of substrate 21. Since an electric field of higher intensity allows plasma to be generated more efficiently, the plasma density approximately right above the periphery of substrate 21, i.e., at the outer periphery of space 50 becomes higher than that in other regions.

In the etching apparatus, plasma generated in space 50 travels downward while diffusing. Though some plasma travels from the outer periphery of space 50 to the inner wall of processing chamber 11 and dissipates, plasma exists in relatively high density at the outer periphery of space 50. Therefore, the plasma arriving in the neighborhood of the periphery of the top surface of substrate 21 and that arriving around the center thereof can substantially be equalized.

As a result, the plasma density at the top surface of substrate 21 can be uniformized, and thus, a constant rate of the plasma etching process can be established in the entire region of substrate 21.

The perimetric length of each of the loops (conducting wires 31A-31D) in antenna 30 herein corresponds to a wavelength $\lambda g$ of radio frequency current flowing through conducting wires 31A-31D. However, the perimetric length may be a natural number multiple of $\lambda g$.

Antenna 30 in the embodiment above has four conducting wires 31A-31D. However, the number of these wires is not limited thereto, and at least two conducting wires are required.

Second Embodiment

Figure 5:
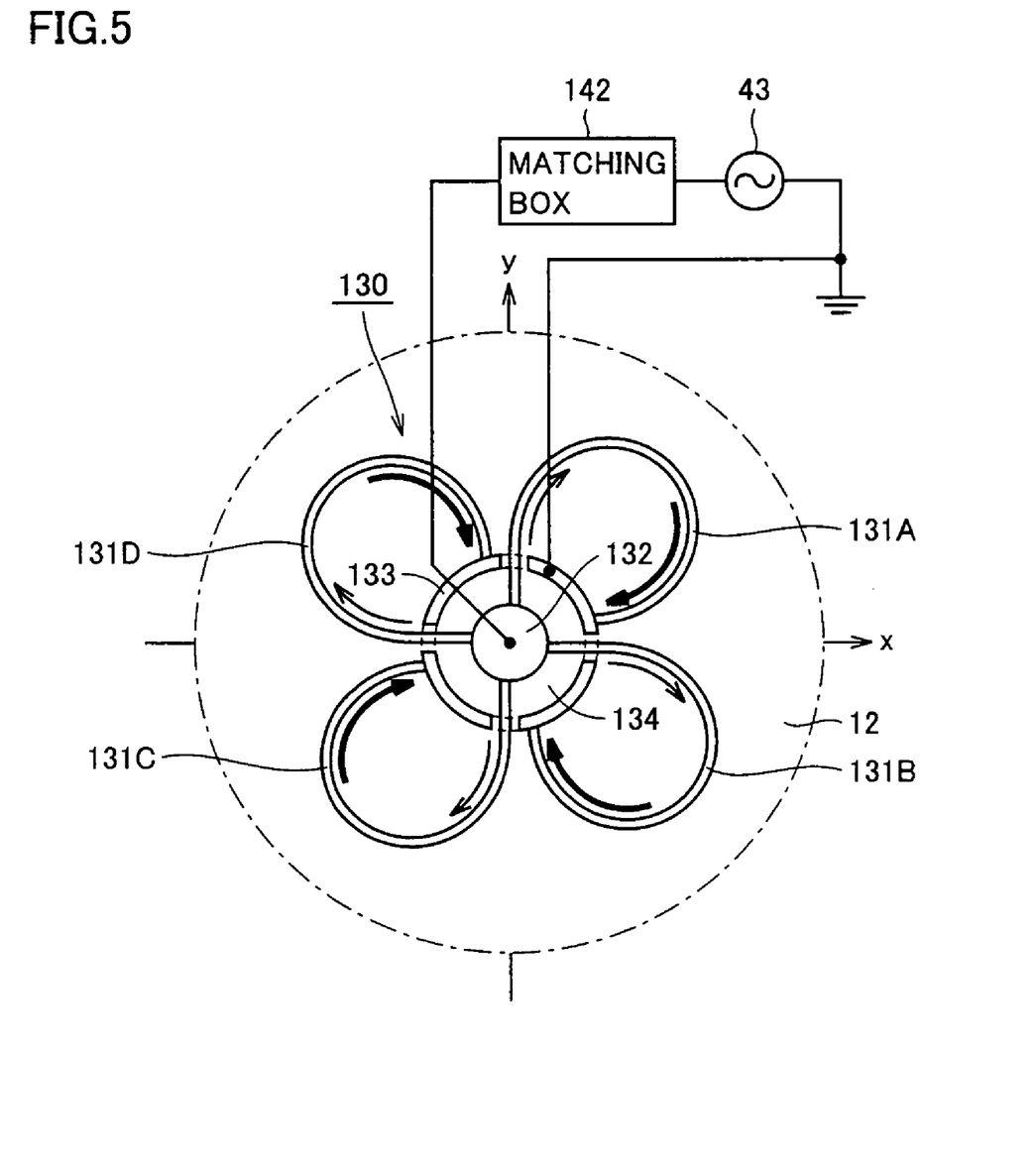
FIG. 5 is a plan view showing a configuration of an antenna used for an etching apparatus in accordance with a second embodiment of the present invention.

A configuration of an antenna used in an etching apparatus in accordance with a second embodiment of the present invention will now be described in connection with FIG. 5. In FIG. 5, elements similar to those in FIG. 2A are represented by the same reference characters and the description thereof will not be repeated as appropriate.

For an antenna 130 shown in FIG. 5, the perimetric length of a loop formed by each of four conducting wires 131A, 131B, 131C and 131D is shorter than a wavelength $\lambda g$ of radio frequency current flowing through the conducting wires 131A-131D. The perimetric length of each of the loops (conducting wires 31A-31D) herein corresponds to about $\lambda g/4$.

A columnar conductor 132 is connected to radio frequency power supply 43 through a matching box 142 while a conductor ring 133 is connected to ground. Each of conducting wires 131A-131D is provided with current of same amplitude and same phase. In this case, radio frequency current whose amplitude is sinusoidally altered flows across respective ends of conducting wires 131A-131D. The four loops (conducting wires 131A-131D) form an antenna composed of a plurality of current elements.

The amplitude of radio frequency current flowing through each of conducting wires 131A-131D is zero at one end connected to columnar conductor 132 and is maximum at the other end connected to conductor ring 133, through a sinusoidal change between both ends thereof.

Accordingly, by changing the diameter of conductor ring 133 to which the other end of each of conducting wires 131A-131D is connected, the region where large radio frequency current flows through each of conducting wires 131A-131D can be adjusted in the radial direction of processing chamber 11.

As in the case of antenna 30 shown in FIG. 1 and FIG. 2A, radio frequency current flowing through conducting wires 131A-131D forms an inductive electric field in processing chamber 11 to generate plasma in upper space 50 of substrate 21, i.e., the object of processing. Accordingly, by adjusting antenna 130 such that large radio frequency current flows approximately right above the periphery of substrate 21, plasma density can be increased at the outer periphery of space 50, and hence plasma distribution can be improved at the top surface of substrate 21. As a result, etching can be performed in the entire region of substrate 21 at more uniformized rate than the conventional case.

Third Embodiment

Figure 6:
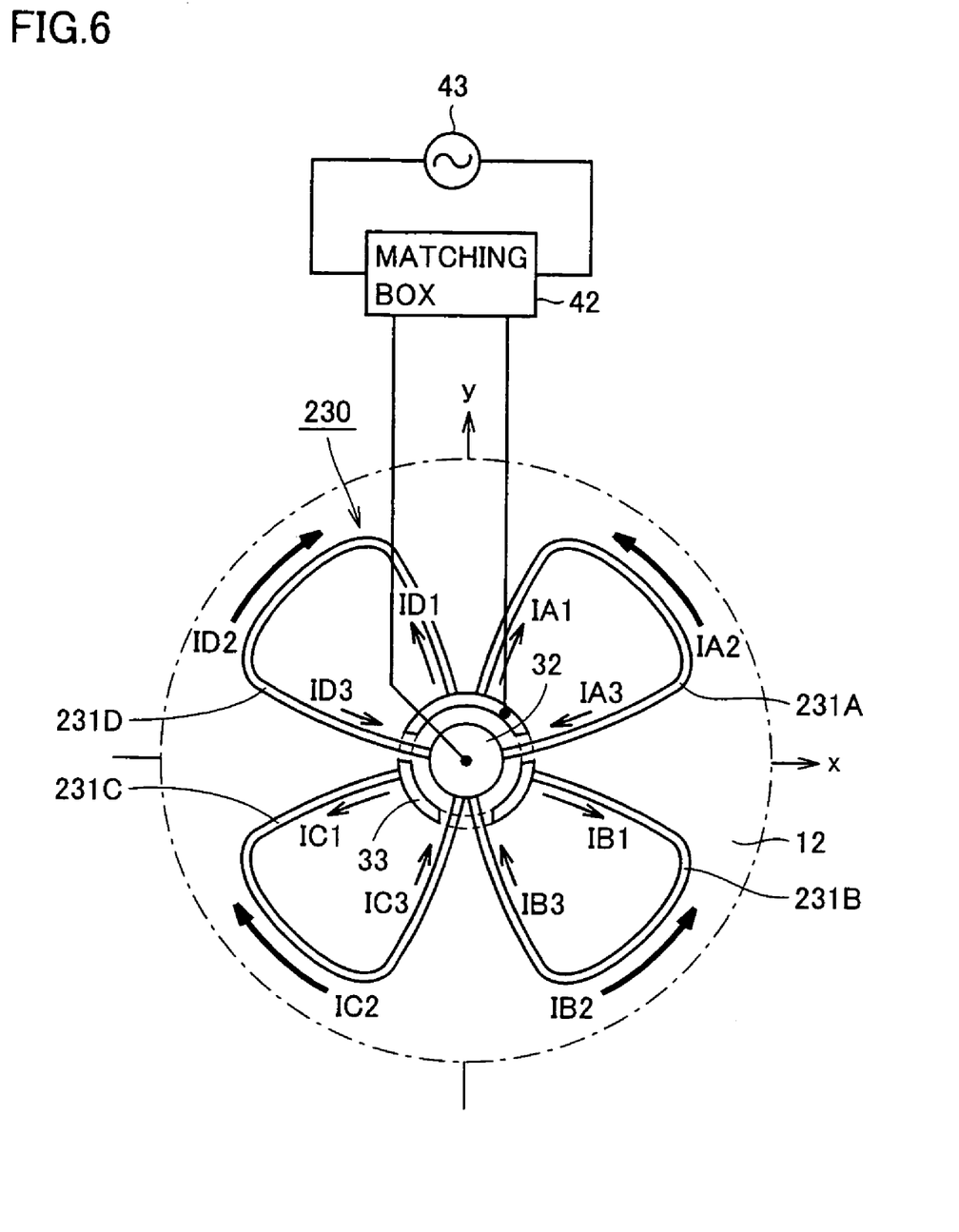
FIG. 6 is a plan view showing a configuration of an antenna used for an etching apparatus in accordance with a third embodiment of the present invention.

A configuration of an antenna used in an etching apparatus in accordance with a third embodiment of the present invention will now be described in connection with FIG. 6. An antenna 230 shown in FIG. 6 is an antenna which has four conducting wires connected in a different manner. As in the case of antenna 30 shown in FIG. 2A, each of conducting wires 231A, 231B, 231C and 231D is spaced 90° apart from each other around columnar conductor 32.

Loops formed by respective conducting wires 231A and 231B and loops formed by respective conducting wires 231D and 231C are connected to columnar conductor 32 and conductor ring 33 such that both of the loops are symmetric with each other about the y-axis running through the center of columnar conductor 32.

Furthermore, the loop formed by conducting wire 231A and the loop formed by conducting wire 231B are connected to columnar conductor 32 and conductor ring 33 to be 90° rotationally-symmetric around the axis orthogonal to mounting table 22, with columnar conductor 32 as the center. Similarly, the loop formed by conducting wire 231C and the loop formed by conducting wire 231D are connected to columnar conductor 32 and conductor ring 33 to be 90° rotationally-symmetric around the axis orthogonal to mounting table 22, with columnar conductor 32 as the center.

The loop formed by each of conducting wires 231A-231D has the shape of an isosceles triangle with its corners rounded. The perimetric length of each of the loops (conducting wires 231A-231D) herein corresponds to a wavelength $\lambda g$ of radio frequency current flowing through conducting wires 231A-231D. The remaining configuration is similar to that of antenna 30 shown in FIG. 2A, and hence, the description thereof will not be repeated.

Figure 7A:
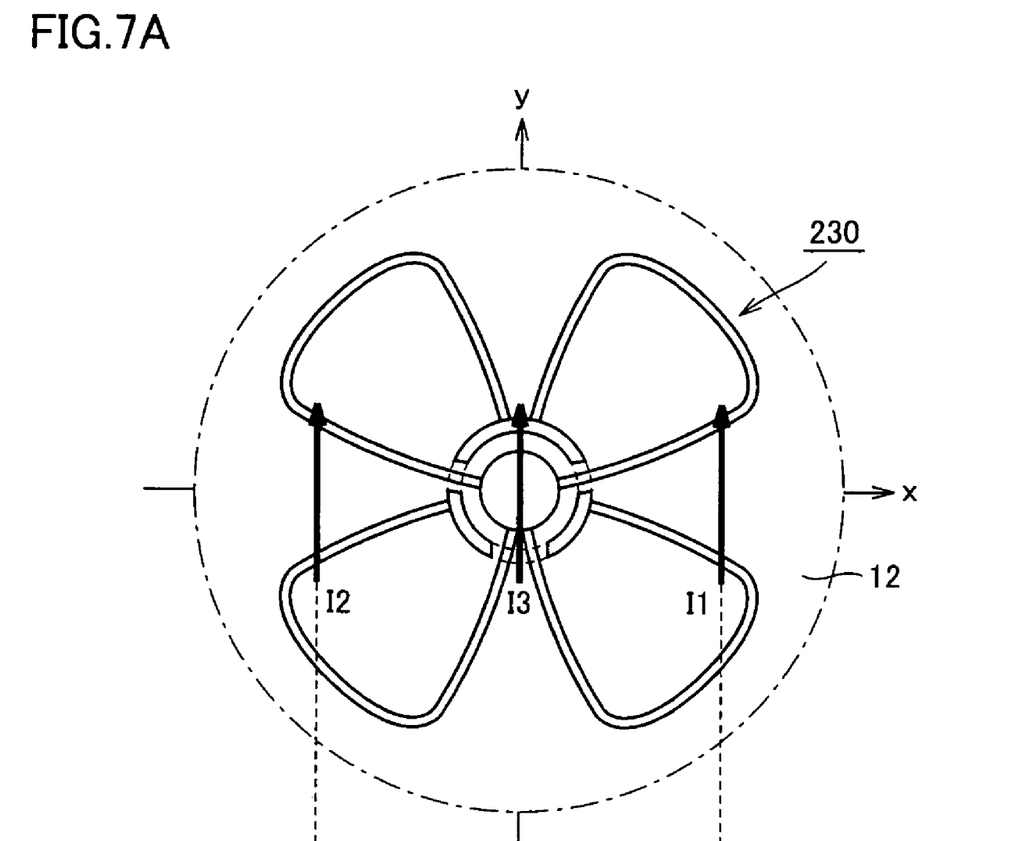
FIG. 7A is a first explanatory view showing the effect of the antenna shown in FIG. 6 in the third embodiment of the present invention.
Figure 7B:
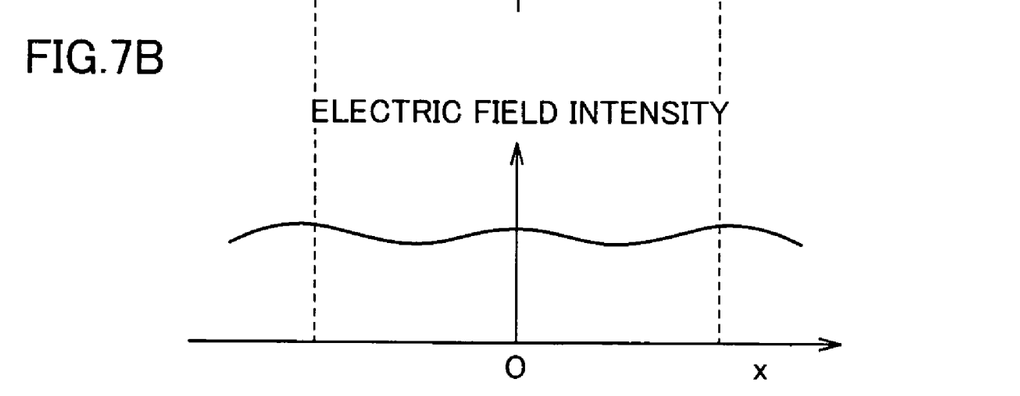
FIG. 7B is a second explanatory view showing an effect of action of the antenna shown in FIG. 6 in the third embodiment of the present invention.

FIG. 7A shows dipole current generated at antenna 230. FIG. 7B shows its electric field intensity distribution in the xz-plane. As in the case of antenna 30 shown in FIG. 2A, antenna 230 has each of conducting wires 231A-231D provided with current of same phase and same amplitude. The radio frequency current supplied to each of conducting wires 231A-231D resonates, resulting in a standing wave.

In this state, large radio frequency currents IA2-ID2 at outer peripheries of the loops formed by respective conducting wires 231A-231D form two dipole currents I1 and I2 in the vicinity of the outer periphery of the loops (conducting wires 231A-231D).

More specifically, radio frequency currents IA2 and IB2 at the outer peripheries of loops formed by respective conducting wires 231A and 231B form dipole current I1, while radio frequency currents IC2 and ID2 at outer peripheries of loops formed by respective conducting wires 231C and 231D form dipole current I2.

Furthermore, the remaining radio frequency currents IA1-ID1 and IA3-ID3 in the vicinity of a junction of each of conducting wires 231A-231D, not cancelled with each other, form dipole current I3. As such, a multiple dipole antenna can be formed virtually. Accordingly, its electric field intensity in the xz-plane is distributed as shown in FIG. 7B, and a strong electric field is established in the vicinity of dipole currents I1-I3.

As in the case of antenna 30 shown in FIG. 2A, dipole currents I1-I3 form an inductive electric field in processing chamber 11 to generate plasma in upper space 50 of substrate 21, i.e., the object of processing.

Since dipole currents I1 and I2 are formed in the vicinity of outer peripheries of loops formed by respective conducting wires 231A-231D, plasma density at the outer periphery of space 50, that is, plasma density in the vicinity of the periphery of a top surface of substrate 21 can be increased. As a result, the etching rate can be improved in the vicinity of the periphery of the top surface of substrate 21, as compared to the conventional case.

Though antenna 230 has four conducting wires 231A-231D in the embodiment described above, the number thereof may be any even number of at least two. In this case, a plurality of loops positioned on one side relative to the y-axis (such as x>0) may be arranged at an equal spacing to be rotationally-symmetric around the axis orthogonal to mounting table 22, with columnar conductor 32 as the center. The same applies for a plurality of loops positioned on the other side relative to the y-axis (such as x<0).

In the embodiment described above, a plasma apparatus in accordance with the present invention is applied to an etching apparatus. However, the plasma apparatus may be applied to other plasma apparatuses such as a plasma CVD apparatus.

As described above, the plasma apparatus in accordance with the present invention has a configuration in which a plurality of conducting wires, each forming a loop, are connected in parallel with a radio frequency power supply to serve as an antenna for supplying a radio-frequency wave into a processing chamber. Accordingly, a strong electric field is established at the region facing the periphery of the top surface of an element to be processed placed on a mounting table, and thus, high density plasma can be generated in the region.

Accordingly, even though some plasma travels toward the inner wall of the processing chamber and dissipates, plasma density can be improved in the vicinity of the periphery of the top surface of the element to be processed. As a result, the processing rate can be improved in this region.

It should be noted that the embodiments disclosed herein are shown as an example, not as a limitation in every aspect. The scope of the present invention is defined not by the description above but by the scope of the appended claims, and equivalents of the scope of the claims and all of the modifications within the scope thereof are intended to be included.

INDUSTRIAL APPLICABILITY

The present invention is effectively applied to a configuration which improves plasma uniformity in a plasma apparatus.

The invention claimed is:
1. A plasma apparatus comprising:
a processing chamber carrying an element to be processed to perform a prescribed process thereon;
an antenna having a plurality of loops, each formed by a conducting wire having a first end and a second end, to supply a radio-frequency wave into said processing chamber; and
a radio frequency power supply to supply power to said antenna, wherein:
each of said plurality of loops, having substantially a same perimetric length, is connected in parallel with said radio frequency power supply and is arranged radially on one and the same plane facing the element to be processed carried in said processing chamber, and the first and second conducting wire ends are located within an outermost periphery of each respective loop;
the plurality of loops includes adjacent sides;
a current flowing through one side of a first loop and a current flowing through an adjacent side of a second loop flow in a same direction;
the plurality of loops comprises four loops arranged at an equal spacing to be rotationally symmetric; and
a current flowing through a second side of the first loop and a current flowing through an adjacent side of a third loop flow in reverse directions.

2. The plasma apparatus according to claim 1, wherein said antenna further includes
a first conductor member arranged at a position facing a center region of the element to be processed carried in said processing chamber and connected to one end of said radio frequency power supply, and
a second conductor member arranged around said first conductor member and connected to the other end of said radio frequency power supply, wherein
each of said plurality of loops has one end of said conducting wire connected to said first conductor member, and the other end of said conducting wire connected to said second conductor member, and
each of said plurality of loops is located outside said second conductor member.

3. The plasma apparatus according to claim 2, wherein each of said plurality of loops has a part of said conducting wire arranged to face a periphery of the element to be processed carried in said processing chamber.

4. The plasma apparatus according to claim 2, wherein said perimetric length of each of said plurality of loops is substantially a natural number multiple of a wavelength of radio frequency current flowing through the conducting wire forming the loop.

5. The plasma apparatus according to claim 1, wherein each of said plurality of loops has a part of said conducting wire arranged to face a periphery of said element to be processed carried in said processing chamber.

6. The plasma apparatus according to claim 1, wherein said perimetric length of each of said plurality of loops is substantially a natural number multiple of a wavelength of radio frequency current flowing through the conducting wire forming the loop.

7. A plasma apparatus comprising:
a processing chamber carrying an element to be processed to perform a prescribed process thereon;
an antenna having a plurality of loops, each formed by a conducting wire having a first end and a second end, to supply a radio-frequency wave into said processing chamber; and
a radio frequency power supply to supply power to said antenna,
wherein:
each of said plurality of loops, having substantially a same perimetric length, is connected in parallel with said radio frequency power supply and is arranged radially on one and the same plane facing the element to be processed carried in said processing chamber, and the first and second conducting wire ends are located within an outermost periphery of each respective loop;
the plurality of loops includes adjacent sides;
a current flowing through one side of a first loop and a current flowing through an adjacent side of a second loop flow in a same direction; and
in one loop and in a different loop adjacent to the one loop in the plurality of loops, current flows from one end to the other end of each of the loops through its outermost periphery, and the one loop and the different loop are disposed such that a portion of the one loop where current flows from the one end to the outermost periphery of the one loop, and a portion of the different loop where current flows from the outermost periphery to the other end of the different loop are disposed adjacent to each other.

* * * * *